US012808920B2

(12) United States Patent
Frolov et al.

(10) Patent No.: US 12,808,920 B2
(45) Date of Patent: Nov. 24, 2026

(54) IN-SITU DIAGNOSTICS OF MICROWAVE INTERCONNECTS FOR QUANTUM COMPUTERS

(71) Applicant: International Business Machines Corporation, Armonk, NY (US)

(72) Inventors: Daniil Frolov, New York, NY (US); Sudipto Chakraborty, Plano, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 204 days.

(21) Appl. No.: 18/805,523

(22) Filed: Aug. 14, 2024

(65) Prior Publication Data

US 2026/0118400 A1 Apr. 30, 2026

(51) Int. Cl.
*G01R 31/11* (2006.01)
*G06N 10/40* (2022.01)

(52) U.S. Cl.
CPC ............. *G01R 31/11* (2013.01); *G06N 10/40* (2022.01)

(58) Field of Classification Search
CPC ................................ G01R 31/11; G06N 10/40
USPC .................................... 324/762.01, 537, 500
See application file for complete search history.

(56) References Cited

U.S. PATENT DOCUMENTS 4,495,807 A * 1/1985 Field ..................... G01F 23/284 73/304 R
11,695,418 B2 * 7/2023 Archambault ......... G06N 10/40 327/528
11,929,711 B2 3/2024 Bardin
12,069,966 B2 * 8/2024 Plourde .................. H10N 69/00
12,675,721 B2 * 7/2026 Sandberg ............... G06N 10/00
2022/0156620 A1 5/2022 Mcdermott, III et al.
2022/0247386 A1 8/2022 Barnes et al.
2022/0399890 A1 * 12/2022 Archambault ......... G06N 10/40
2023/0196163 A1 * 6/2023 Mamin .................. G06N 10/40 706/62
2023/0196176 A1 6/2023 Khammassi
2024/0022248 A1 1/2024 Pellerano et al.
2024/0045465 A1 2/2024 Heer et al.
2026/0039297 A1 * 2/2026 Hopfmueller .......... G06N 10/40

FOREIGN PATENT DOCUMENTS

EP 3475217 B1 11/2019

OTHER PUBLICATIONS

Chang et al., "A Spread-Spectrum Clock Generator With Triangular Modulation", IEEE Journal of Solid-State Circuits, vol. 38, No. 4, pp. 673-676, Apr. 2003, doi: 10.1109/JSSC.2003.809521.

* cited by examiner

*Primary Examiner* — Giovanni Astacio-Oquendo
(74) *Attorney, Agent, or Firm* — Amin, Turocy & Watson, LLP

(57) ABSTRACT

A system comprises a digitally programmable frequency chirp generator configured to generate a frequency chirp, an attenuator coupled to the digitally programmable frequency chirp generator and a directional device integrated into a cryogenic circuit configured to control superconducting qubits and coupled to the digitally programmable frequency chirp generator. The directional device comprises a main arbitrary waveform generator and an on-chip programmable self-interference canceller.

20 Claims, 16 Drawing Sheets

IN-SITU DIAGNOSTICS OF MICROWAVE INTERCONNECTS FOR QUANTUM COMPUTERS

BACKGROUND

The present invention relates generally to the electrical, electronic and computer arts and, more particularly, to quantum computers.

Quantum computing systems with a large number of qubits, such as over 10,000 qubits, will require control and readout electronics to be custom designed in, for example, complementary metal-oxide semiconductor (CMOS) located inside a dilution refrigerator. The initial bring-up and industrial production of these systems will require testing tens of thousands of microwave transmission lines without direct access to the microwave transmission lines at room temperature (a temperature of 300 Kelvin (K)), especially when the system is cooled to operational temperatures. Standard approaches for such characterization include the use of a time domain reflectometer (TDR) with a sampling oscilloscope or extraction of a TDR curve based on an reflection or transmission coefficient measurement in the frequency domain using a vector network analyzer (VNA). These approaches, however, require a fast pulse generator and a wideband sampler/analog front end that is not practical for certain cryogenic complementary metal-oxide semiconductor (cryo-CMOS) arbitrary waveform generators (AWGs) designed to control qubits in a specific narrowband frequency range and for direct access to transmission lines at room temperature (which is not practical for cryo-CMOS).

BRIEF SUMMARY

Principles of the invention provide systems and techniques for in-situ diagnostics of microwave interconnects for quantum computers. In one aspect, an exemplary method includes the operations of enabling a directional device integrated into a cryogenic circuit while performing time domain reflectometry on a control line of a qubit; and disabling the directional device while generating control signals for the qubit.

In one aspect, a system comprises a digitally programmable frequency chirp generator configured to generate a frequency chirp; an attenuator coupled to the digitally programmable frequency chirp generator; and a directional device integrated into a cryogenic circuit configured to control superconducting qubits and coupled to the digitally programmable frequency chirp generator, the directional device comprising a main arbitrary waveform generator and an on-chip programmable self-interference canceller.

In one aspect, a directional device comprises a first port; a second port; and a third port, wherein the directional device is configured to pass a signal from the first port to the second port, to block a signal from passing from the second port to the first port, to pass a signal from the second port to the third port, and to isolate the first port from the third port.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by instructions executing on a remote processor, or the like, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- a TDR measurement system that can be exercised anytime during the lifetime of the system and that implementable in, for example, commercially available CMOS technologies—the system improves the technological process of in-situ diagnostics of microwave interconnects for quantum computers;
- techniques that enable a fully integrated, low area solution for TDR measurements using in-situ hardware, resulting in a low-power, low-cost, scalable solution;
- replacement of expensive time domain reflectometry by digitally reconfigurable frequency domain measurement using in-situ electronics.
- a programmable reflectometer using digital control;
- an on-chip reflectometer for transmission lines using, for example, CMOS transistors;
- in-situ arbitrary waveform generators (AWG) constructs coupled in parallel that are used to enable TDR measurements without the need for a physical switch that would reduce the quality factor of the output balun;
- nearly no additional imbalance is added to the main AWG from the coupler to the qubit and nearly no additional loading is added from the reflectometer;
- TDR measurements using chirp signals that last several seconds, resulting in a measured frequency difference that is very small (such as 10 or 100 Hz) and that thus enables usage of a slow analog-to-digital converter (designed to consume little power) as part of the TDR measurement system;
- a reflectometer bridge characterized by reconfigurable impedance levels (enabling coupling to different impedance ports, including other than 50 ohms), direct current (DC) and alternating current (AC) coupled configurations and fully adjustable bias controls (suitable for scaled CMOS as the NMOS and PMOS circuitry become equally strong);
- a reflectometer bridge characterized by decoupled AC and DC parameters, simple biasing, reconfigurable impedance levels and scalability with technology.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 13A is a graph showing the impedances of an example circulator at different ports, in accordance with example embodiments;

FIG. 13B is a graph showing the forward transmission from Port 2 to Port 3 and Port 2 to Port 1, in accordance with example embodiments;

FIG. 13C is a graph showing the forward transmission from Port 1 to Port 2 and to the isolated port pair (Port 1 to Port 3), in accordance with example embodiments;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
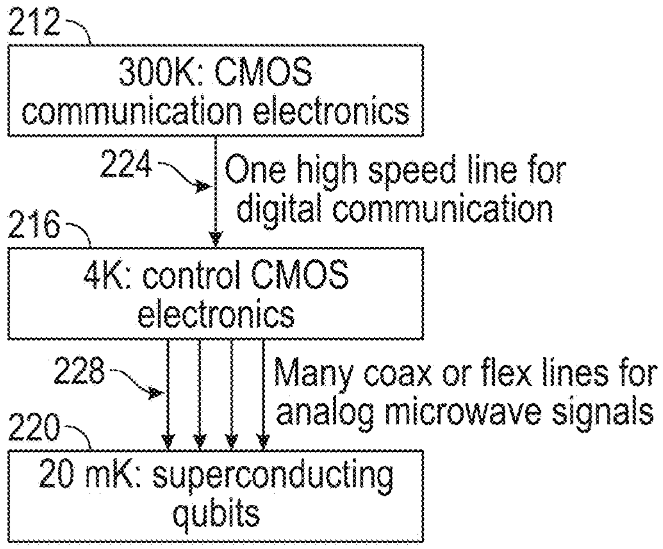
FIG. 1 illustrates a simplified architecture of a quantum computing system.

Quantum computing systems with a large number of qubits, such as over 10,000 qubits, may require control and readout electronics to be custom designed in, for example, a complementary metal-oxide semiconductor (CMOS) circuit located inside a dilution refrigerator. FIG. 1 illustrates a simplified architecture of such a quantum computing system. The CMOS communication electronics 212 is operating at a temperature of approximately 300 Kelvin (300K). In one example embodiment, a high-speed digital communication line 224 provides communication between the CMOS communication electronics 212 and control CMOS electronics 216 that are operating at temperature of 4K. The control CMOS electronics 216 communicates with superconducting qubits 220 operating at 20 mK via a plurality of coaxial or flex lines 228 configured for analog microwave signals. For example, eight qubits may have eight corresponding coaxial or flex lines 228.

In one example embodiment, an on-chip reflectometer uses, for example, CMOS transistors. Radio frequency (RF) AWG and a reflectometer are coupled to each other for both qubit control signals generation and TDR measurements without the need for a physical switch that would reduce performance of the RF AWG. The reflectometer shares the same output network with the RF AWG and can be digitally turned on and off. When the reflectometer is turned off, the RF AWG is used to generate control signals for the qubit. When the reflectometer is turned on, the RF AWG can be used to generate RF waveforms required to perform time domain reflectometry. The solution can be exercised anytime during the lifetime of the system. Example embodiments can be implemented in commercially available CMOS technologies. Simulations demonstrate the feasibility of the example embodiments. Nearly no additional imbalance is added to the main AWG from the qubit coupler and nearly no additional loading is added from the reflectometer.

Figure 2:
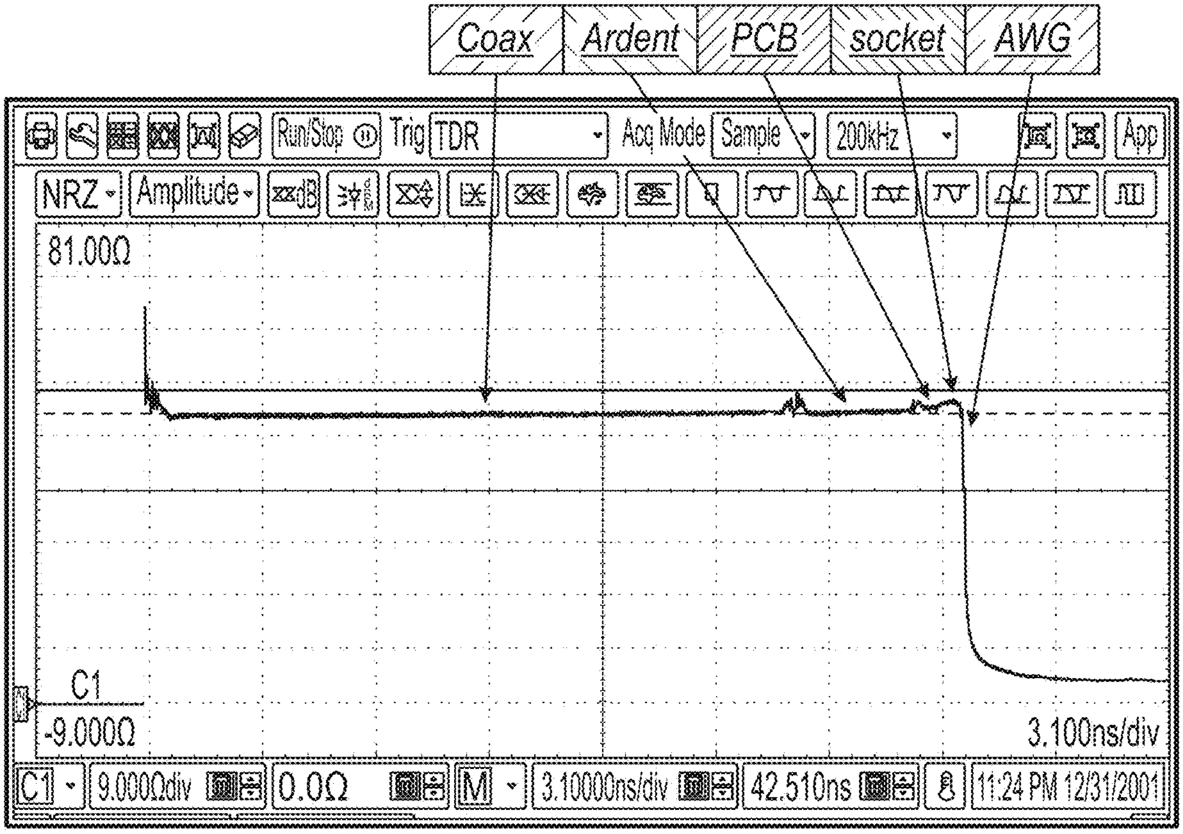
FIG. 2 is an example TDR measurement for a single channel of an eight channel cryo-CMOS AWG.

FIG. 2 is an example TDR measurement for a single channel of an eight channel cryo-CMOS AWG. The TDR measurement of FIG. 2 was performed using a conventional 40 Gigahertz (GHz) sampling oscilloscope. As illustrated in FIG. 2, different regions of the waveform can be recognized. For example, the impedance is relatively uniform along the length of the coax (the first section of the TDR waveform along the x-axis). A bump corresponding to a known, commercially available radio frequency coaxial connector is observed in the waveform followed by another uniform region corresponding to the printed circuit board. The socket associated with the qubit is then encountered along the transmission line. While it is desirable to have the impedance be uniform along the entire transmission line, it is conventionally impractical to test even 1% of the AWG channels in a 100 k qubit system using a standalone TDR instrument.

Figure 3:
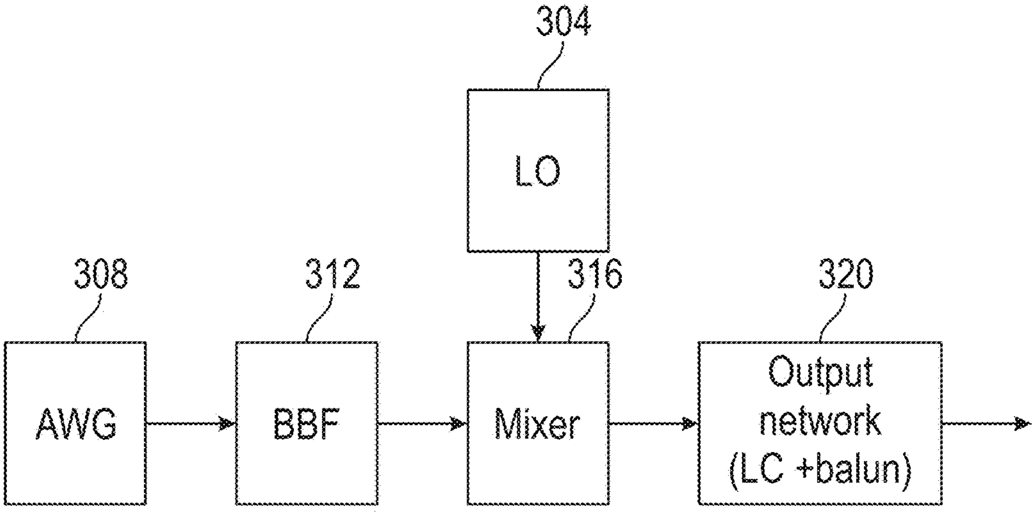
FIG. 3 is a block diagram of a single control channel circuit for a superconducting qubit.

FIG. 3 is a block diagram of a single control channel circuit for a superconducting qubit. An AWG 308 generates arbitrary signals from DC to approximately 500 MHz. The arbitrary signals are filtered by a baseband filter (BBF) 312. A mixer 316 mixes the filtered arbitrary signals with a radio frequency signal generated by a local oscillator 304. The filtered arbitrary signals thus modulate the radio frequency signal produced by the local oscillator 304. The resulting mixed signal is applied to an output network 320 (which essentially acts as a bandpass filter tuned to a certain frequency range, such as 3-8 GHz range). The mixed signal is AC-coupled and sent over a transmission line to a given qubit. In one example embodiment, the output network 320 matches the differential circuit of the single control channel circuit to the downstream circuitry. In example embodiments, the single control channel circuit is implemented on a single CMOS chip.

Since the transmission line to the qubit is not easily accessible at room temperature, it is desirable to build diagnostic circuitry into the control electronics that generate control signals for the qubits, inside the refrigerator where there is no access from a room temperature location. To achieve low power in the cryo-CMOS AWG, the output frequency response is tuned to the desired center frequency with a resonant (LC) circuit, so that the overall bandwidth is practically limited (in a non-limiting example, limited to the 3-8 GHz range, but other embodiments could use different range(s)) and AC-coupled due to the output balun. For scalable cryo-CMOS control electronics, a built-in line test instrument should be part of the AWG output circuit; therefore, it:

will be AC-coupled and limited by the AWG/output analog network bandwidth;

should be a relatively simple circuit; and ideally should avoid fast sampling analog-to-digital converters (ADCs) and fast switching circuits to save electrical power and conserve cooling capacity.

Figure 4:
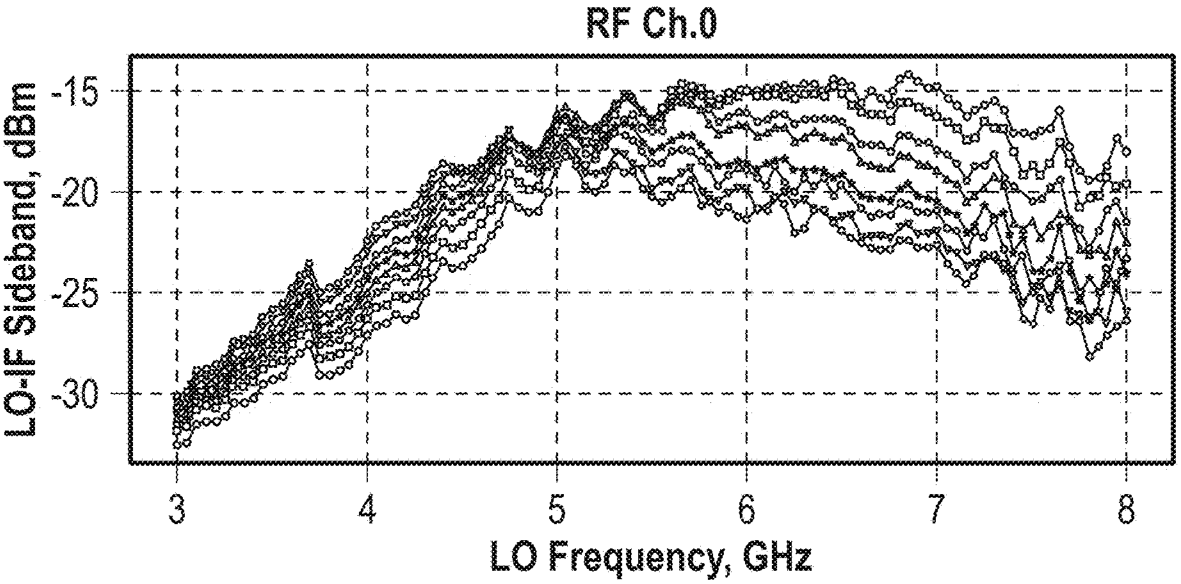
FIG. 4 is an example of a cryo-CMOS radio frequency (RF) AWG frequency response with various values of capacitor in the output resonant (LC) network, in accordance with example embodiments.

FIG. 4 is an example of a cryo-CMOS radio frequency (RF) AWG frequency response with various values of capacitor in the output LC network, in accordance with example embodiments. The vertical axis corresponds to the RF power of the output signal and the horizontal axis corresponds to frequency. Each curve corresponds to different values of capacitance of the output LC network. At a frequency of 8, the top curve corresponds to the lowest capacitance value and the bottom curve corresponds to the highest capacitance value.

Conventional TDR Measurement

Figure 5:
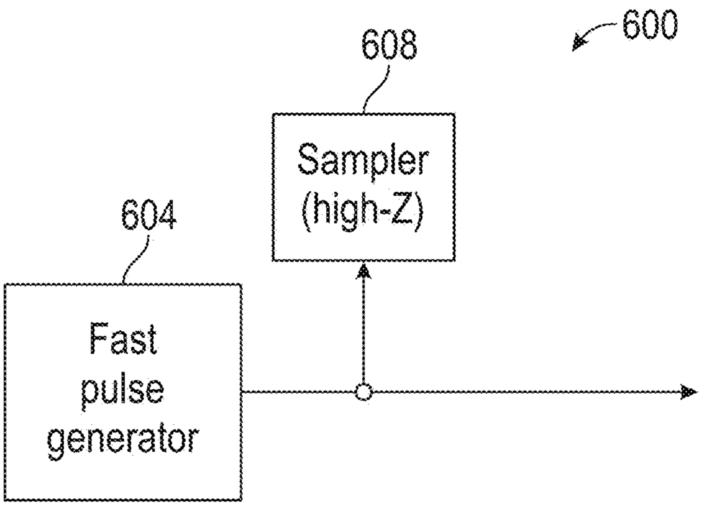
FIGS. 5 and 6 illustrate a high-level block diagram of a conventional TDR measurement system.
Figure 6:
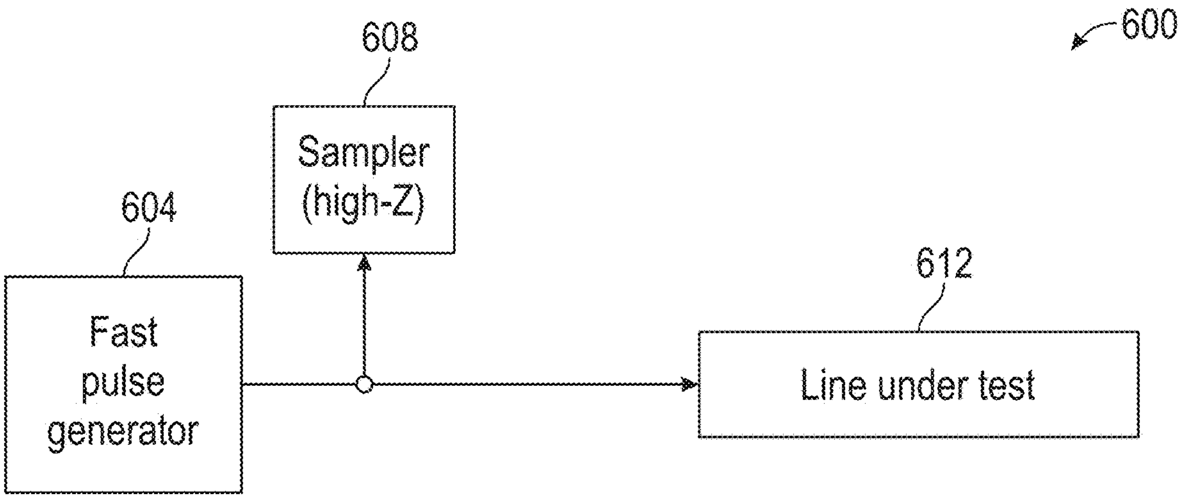

FIGS. 5 and 6 illustrate a high-level block diagram of a conventional TDR measurement system 600. The conventional TDR measurement system 600 uses a sampler 608 (such as a sampling oscilloscope) and a fast rise time pulse generator 604 to perform the TDR measurement. As illustrated in FIG. 6, the fast rise time pulse generator 604 is coupled to a line under test 612. The fast rise time pulse generator 604 generates a step waveform with a fast rise time (such as a sub-nanosecond rise time). The high-impedance, sample and hold analog-to-digital converter of the sampler 608 has a sampling rate that can be made relatively low (on the order of tens of kilohertz (kHz) and lower), although the analog bandwidth of the sampler 608 must be high. The connections must have a bandwidth of direct current (DC) to 30 GHz (depending on the desired resolution).

Disadvantages of the conventional TDR measurement system 600 for cryo-CMOS include:

a high bandwidth requirement of the output RF circuit (on the order of DC to ~10 GHz);

a requirement for a separate fast edge pulse generator; and a noise limitation associated with the high bandwidth of the sampler 608.

Conventional TDR Based on the Frequency Domain Using a Vector Network Analyzer (VNA)

Figure 7:
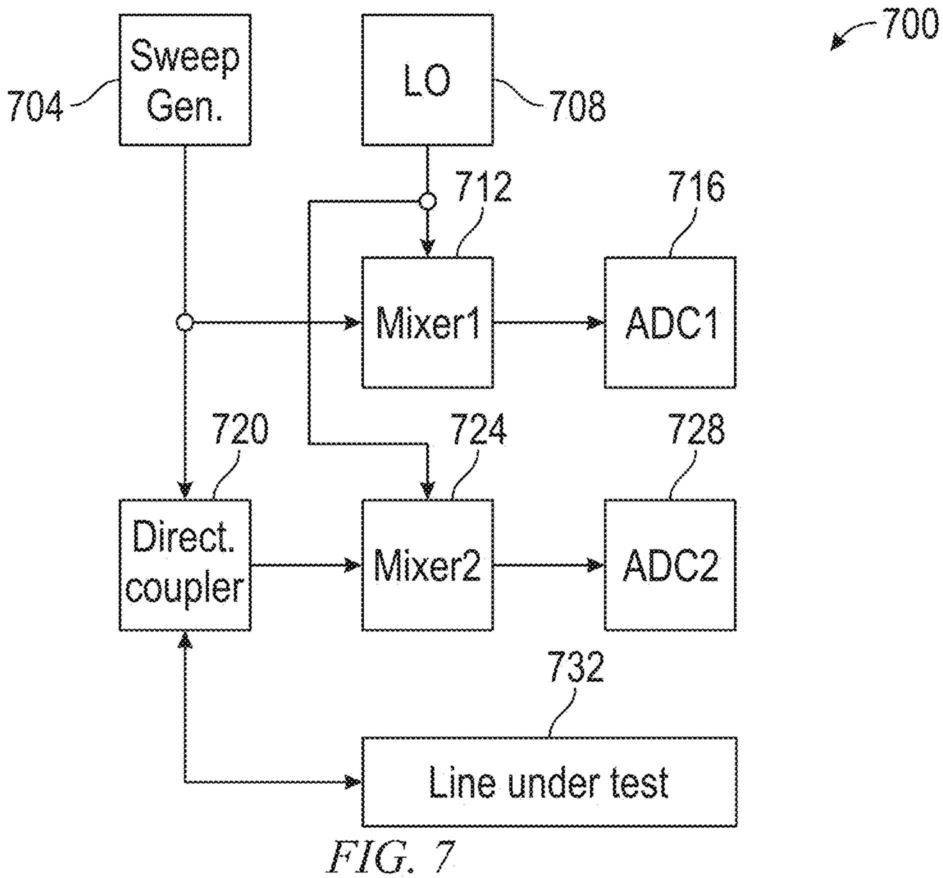
FIG. 7 illustrates a high-level block diagram of a conventional TDR measurement system.

FIG. 7 illustrates a high-level block diagram of a conventional TDR measurement system 700. It is often available as an option in commercial VNAs and therefore requires a more complicated system including a sweep generator 704 locked to a local oscillator 708, two receivers (such as mixers 712, 724), and a directional coupler 720. The sweep generator 704 sweeps a frequency of a signal from, for example, 10 MHz to 10 GHz. The swept signal is sent to a mixer 712 and transmitted down the line under test 732 via the directional coupler 720. The reflected signal is returned to the mixer 724 via the directional coupler 720. The mixers 712, 724 down-convert the original swept signal and the reflected signal to low frequency signals that are then digitized by analog-to-digital converters (ADCs) 716, 728. The forward and reflected waves are then compared at each frequency to measure the complex reflection coefficient (both magnitude and phase) in the frequency domain.

An inverse fast-Fourier transform (FFT) (IFFT) is then performed to convert the frequency domain signal back to the time domain. For example, an S11 measurement in vector form in the frequency domain can be converted to the time domain using an IFFT and an appropriate windowing function resulting in a TDR curve that is generated: this demands a specific frequency step equivalent to $1/T_{max}$, where $T_{max}$ is a maximum measured TDR delay. For practical applications, a typical step is 10 MHz, meaning that the system should have a bandwidth of, for example, 10 MHz to 10 GHz. Several disadvantages of the conventional TDR measurement system using a VNA for cryo-CMOS include a significantly more complicated architecture and, although not direct current (DC), a still low frequency on one side of the band, making it impractical for certain applications.

High-Level Summary

Figure 8:
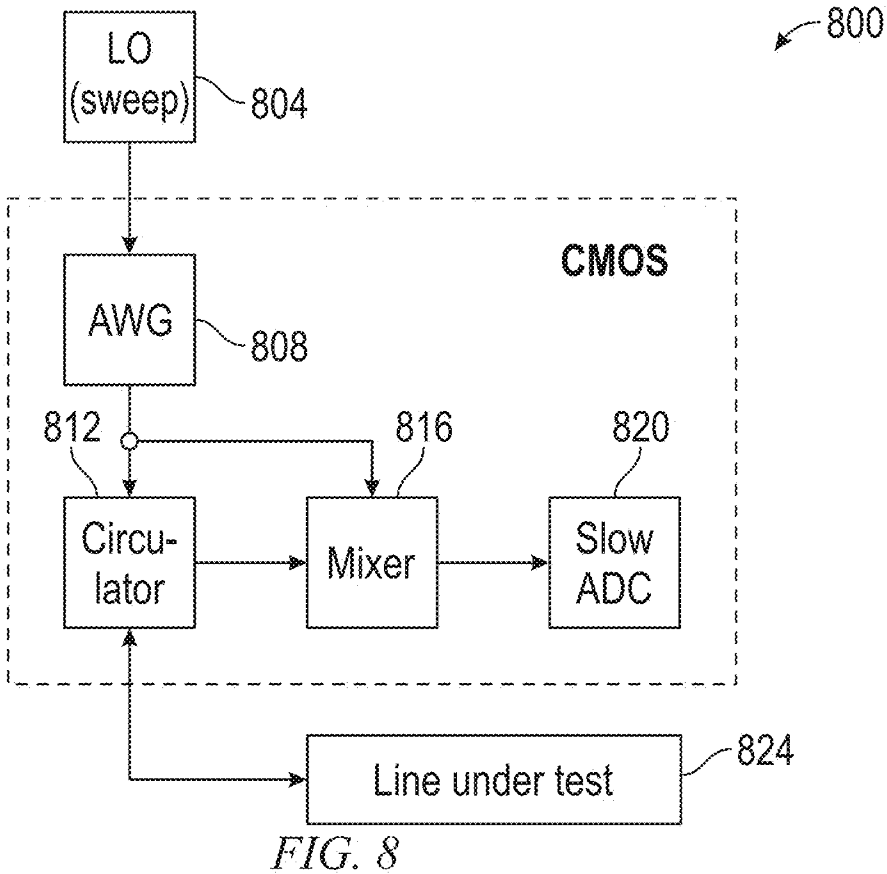
FIG. 8 illustrates a block diagram for a circuit that uses a frequency modulated continuous wave (FMCW) radar scheme to measure impedance discontinuities in transmission lines, in accordance with example embodiments.

FIG. 8 illustrates a block diagram 800 for a circuit that uses a frequency modulated continuous wave (FMCW) radar scheme to measure impedance discontinuities in transmission lines, in accordance with example embodiments. In example embodiments, a local oscillator (LO) 804 sweeps through a range of frequencies to produce a chirp on the output of the RF AWG 808. A directional device 812, also referred to as a circulator herein, is used to separate a forward chirp from the reflected chirp on the line under test 824. The reflected chirp and initially transmitted chirp (forward) are mixed by the mixer 816. Since the reflected chirp is delayed in time, the forward and reflected chirps are shifted relative to each other. The difference in frequency of the signal produced by chirps' multiplication will be proportional to the delay between the chirps. The output of the mixer 816 is fixed in frequency which is proportional to the distance to impedance mismatch and magnitude of the signal is proportional to the magnitude of the impedance mismatch in the line under test 824.

A complex fast-Fourier transform (FFT) of the beating signal (the output of the mixer 816) is performed to extract a distance to the discontinuity (frequency) and an impedance of the discontinuity (complex amplitude). Since discontinuities in the transmission line under test 824 are not moving, the sweep time can be made very slow (on the order of several seconds) and the frequency difference can be very small, such as on the order of 0.1 to 100 Hz. Therefore, a slow analog-to-digital converter (ADC) 820 (configured to consume little power) can be used to digitize the beat tones (in the sound frequency range). Since the sweeping is slow, no special local oscillator source is needed. Such a scheme naturally fits into the design of a radio frequency (RF) AWG.

The circuit of FIG. 8 is suitable for deployment in a number of in-situ configurations, as described more fully below in conjunction with FIGS. 9 and 10.

In a digital-to-analog converter (DAC) configuration (see, FIG. 10), an arbitrary center frequency is synthesized, so a back of the line, numerically-controlled oscillator can be changed.

In a transformer (XMFR) configuration (see, FIG. 9), a balanced to unbalanced transformer 932 is utilized.

In-Situ Measurement Using Current-Mode AWG

Figure 9:
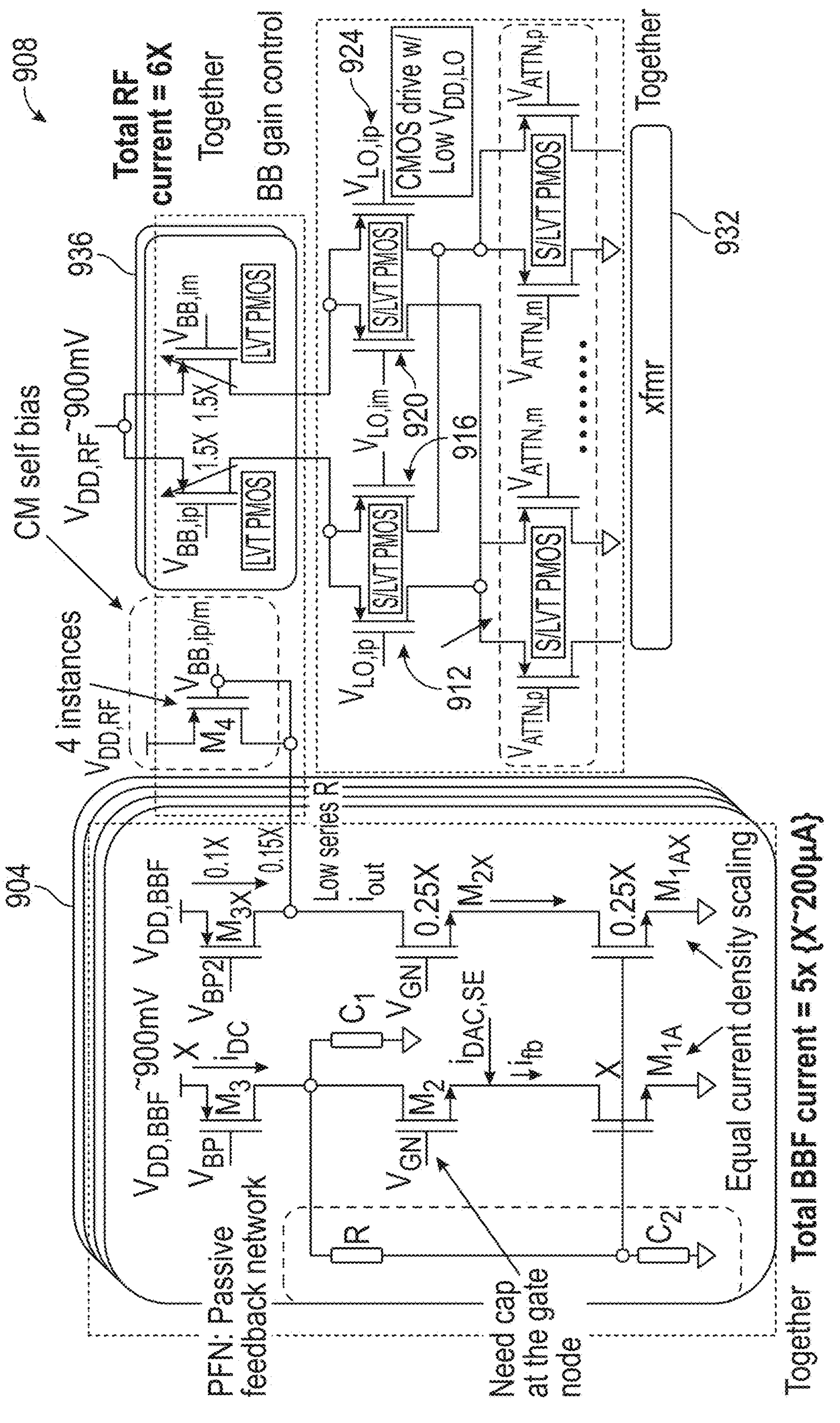
FIG. 9 is a circuit diagram for an in-situ measurement configuration using a current-mode AWG, in accordance with example embodiments.

FIG. 9 is a circuit diagram for an in-situ measurement configuration using a current-mode AWG, in accordance with example embodiments. Gain control is achieved by enabling a number of segments in the baseband (BB) gain control block 936, which is enabled by digital control bits. In example embodiments, a directional circuit is provided to add a reflectometer, as described above in conjunction with FIG. 8, to the circuit of FIG. 9. A phase-locked loop (PLL) can provide the clock for the chirp, where the frequency of the PLL is slowly varied and the variation is slow enough to keep the PLL locked. The chirp is then provided to transistors 912, 916, 920, 924. The digital-to-analog converters (DACs) used in conjunction with the circuit of FIG. 9 can be very simple and can just provide an amplitude (an envelope is not necessary).

In the example embodiment of FIG. 9, a baseband filter 904 uses a single branch of current and provides filtering for the images resulting from the DAC operation. The output signal from the baseband filter 904 is a current that is provided to the mixer circuit 908 which upconverts the filtered baseband signal to the RF frequency. The output of the mixer circuit 908 is a current that is provided to the transformer 932. The transformer 932 provides current gain and reduces the quiescent current in the mixer stack.

In-Situ Measurements with Voltage-Mode BBF

Figure 10:
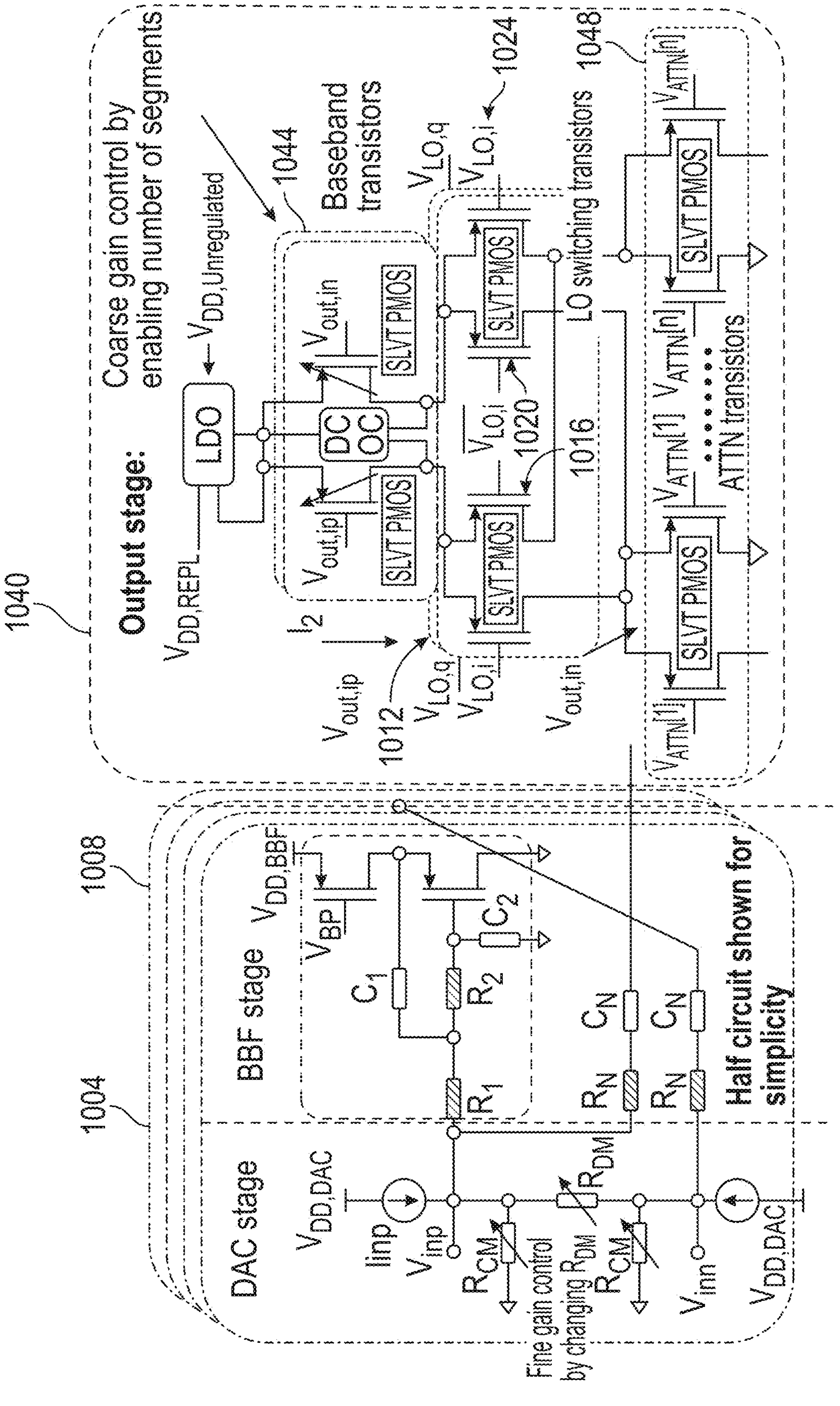
FIG. 10 is a circuit diagram for an in-situ measurement configuration using a voltage-mode baseband filter (BBF) stage, in accordance with example embodiments.

FIG. 10 is a circuit diagram for an in-situ measurement configuration using a voltage-mode baseband filter (BBF) stage 1008, in accordance with example embodiments. The configuration of FIG. 10 is similar to the circuit of FIG. 9, but provides, for example, a voltage mode approach. In example embodiments, a directional circuit is provided to add a reflectometer, as described above in conjunction with FIG. 8, to the circuit of FIG. 10. A set of DAC stages 1004 generate corresponding analog signals that are filtered by a set of baseband filter stages 1008 and then upconverted by an output stage 1040. The output stage 1040 includes a transconductance (gm) stage (see baseband transistors 1044), a switching quad (see transistors 1012, 1024), and a variable gain attenuator (see ATTN transistors 1048). As described above, a phase-locked loop (PLL) can provide the clock for the chirp, where the frequency of the PLL is slowly varied and the variation is slow enough to keep the PLL locked. The chirp is then provided to transistors 1012, 1016, 1020, 1024. The digital-to-analog converters (DACs) used in conjunction with the circuit of FIG. 10 can be very simple and can just provide an amplitude (an envelope is not necessary).

Digitally Configurable CMOS Directional Device

Figure 11:
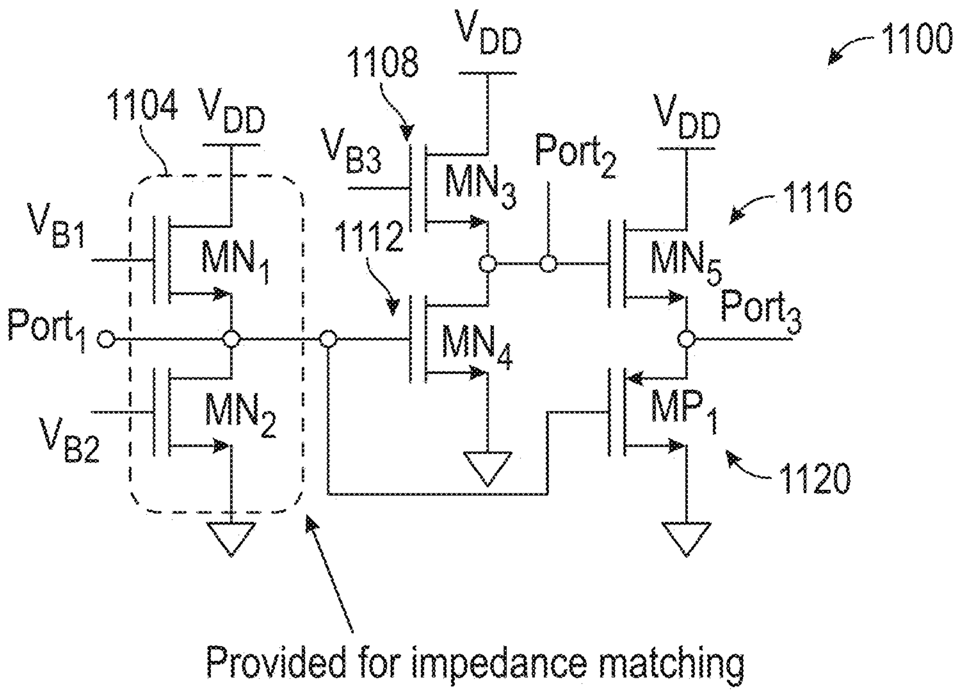
FIG. 11 is a circuit diagram for an example directional device, in accordance with example embodiments.

FIG. 11 is a circuit diagram for an example directional device 1100, in accordance with example embodiments. The directional device 1100 works for all frequencies and can be implemented in CMOS, using bipolar transistors (BJTs), or the like. (The PMOS transistors can be replaced by NMOS transistors and the NMOS transistors can be replaced by PMOS transistors, and the directional device 1100 reoriented accordingly.) Two directional devices 1100 may be implemented in parallel to support differential signals.

In general, a signal flows from Port 1 to Port 2, but not from Port 2 to Port 1. A signal can pass from Port 2 to Port 3; Port 1 is isolated in both directions from Port 3. A bias circuit 1104 biases input Port 1 to provide impedance matching. Transistors 1108, 1112 enable the signal from Port 1 to pass through to Port 3.

Bias voltages $V_{B1}$, $V_{B2}$, $V_{B3}$ are selected, for example, to reduce reflection from Port 1 to a minimum. These voltages are derived from replica bias generators to maintain a constant transconductance of the respective transistors. The replica bias circuit is simply a copy of the main circuit branch with transistors connected with their drain and gate connected together and operating with a PTAT (proportional to absolute temperature) current source.

To incorporate the directional device 1100 as the circulator 812 of FIG. 8, the output of the AWG 808 is coupled to Port 1, Port 2 is coupled to the line under test 824 and Port 3 is coupled to the mixer 816.

Advantages of the directional device 1100 include:

1) a completely CMOS implementation;
2) small circuit area;
3) reconfigurable impedance levels (enabling coupling to different impedance ports, including other than 50 ohms);
4) direct current (DC) and alternating current (AC) coupled configurations;
5) configurable as a power combiner; and/or
6) fully adjustable bias controls (suitable for scaled CMOS as the NMOS and PMOS circuitry become equally strong).

Figure 12:
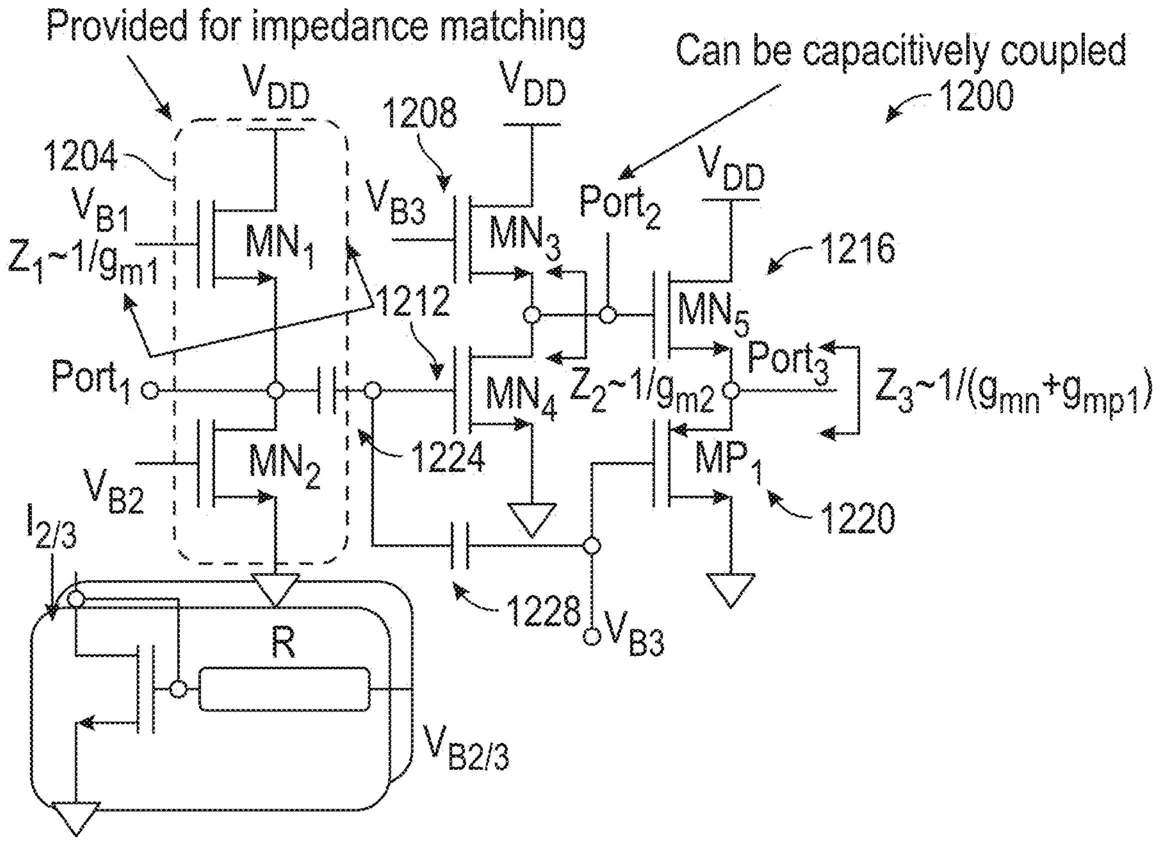
FIG. 12 is a circuit diagram for an example alternating current (AC)-coupled directional device, in accordance with example embodiments.

FIG. 12 is a circuit diagram for an example AC-coupled directional device 1200, in accordance with example embodiments. The directional device 1200 is capacitively coupled for independent impedance and isolation performance using capacitors 1224, 1228. As illustrated in FIG. 12, adjusting bias currents will provide different transconductance $g_{m1}$, $g_{m2}$ values (also known as transfer conductance, which relates current through a device to the voltage across the device), which can be independently adjusted. A bias circuit 1204 biases input Port 1 to provide impedance matching. Transistors 1208, 1212 enable the signal from Port 1 to pass through to Port 3.

The AC-coupled directional device 1200 provides numerous advantages, including:

AC and DC parameters are decoupled;

simple biasing: $V_{B1}=V_{DD}=V_{B3}$;

port impedances can be any value making it easy to interface with low-power circuits;

fully adjustable performance by programming voltage and currents; and/or scales with technology.

Simulation Results for the CMOS Reflectometer

Figure 13A:
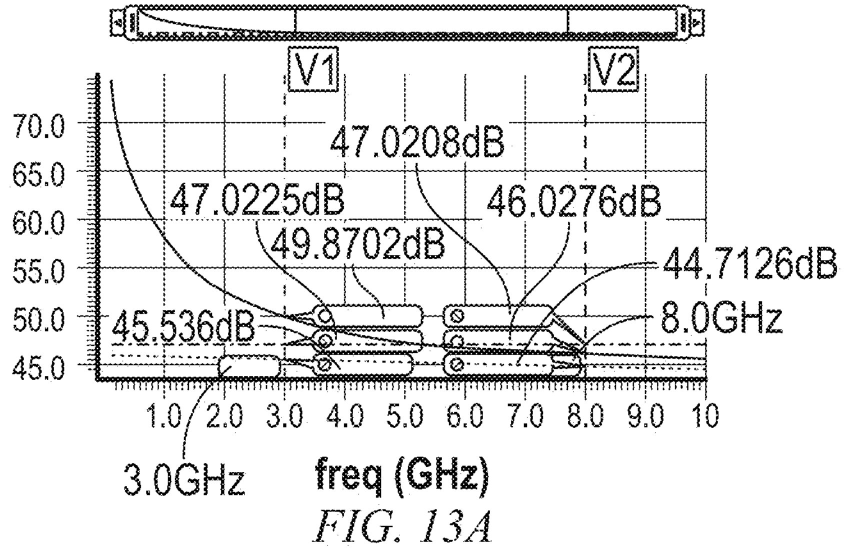
FIGS. 13A-13C are graphs showing simulator results for the reflectometer circuit incorporated as the circulator of FIG. 8, in accordance with example embodiments.
Figure 13B:
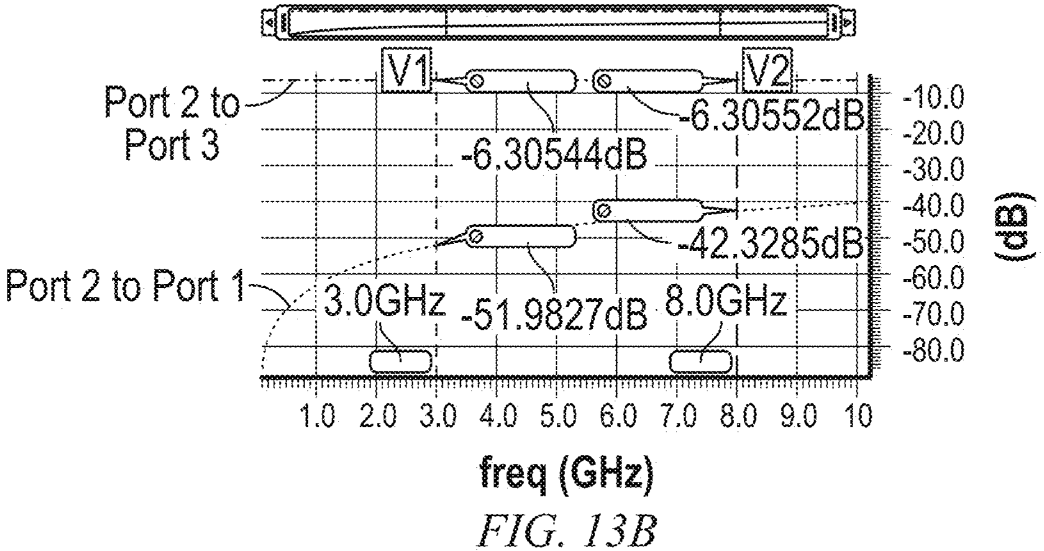
Figure 13C:
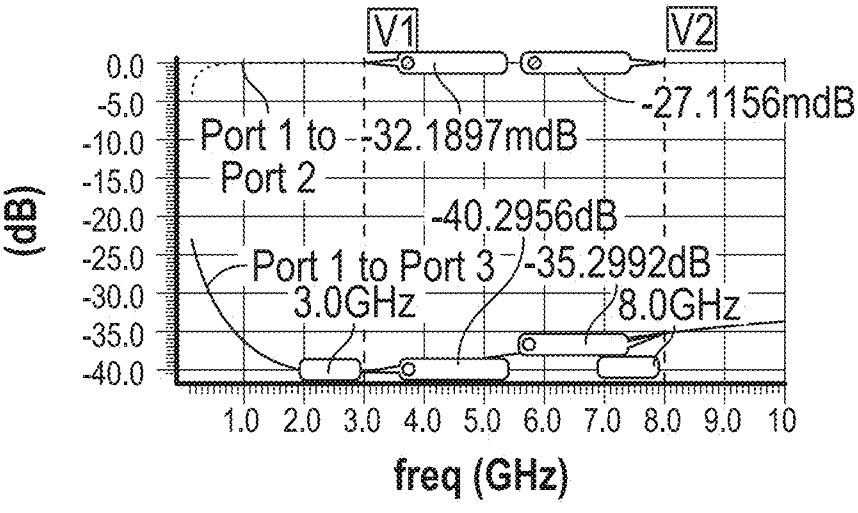

FIGS. 13A-13C are graphs showing simulator results for the directional device 1100 incorporated as the circulator 812 of FIG. 8, in accordance with example embodiments. Arbitrary impedance levels can be realized as a combination of transistor sizes and bias currents (a function of 1/gm) which is known to be stable over variations. Reverse isolation and isolated port signal levels are between −40 to −35 dB over the 3-8 GHz range, with power P=1.8 mW.

FIG. 13A is a graph showing the impedances of an example circulator at different ports, in accordance with example embodiments. The results all show that, at the desired frequency of operation (for example, 3-8 GHz), the impedances are close to 50 ohms. However, by construction, it could be possible for the input impedance of Port 1 to be 70 ohms while Port 2 can be at 50 ohms, and Port 3 at 60 ohms. FIG. 13B is a graph showing the forward transmission from Port 2 to Port 3 and Port 2 to Port 1, in accordance with example embodiments. This is a situation where the input is at Port 2 and the outputs can be at Port 1 and Port 3.

FIG. 13C is a graph showing the forward transmission from Port 1 to Port 2 and to the isolated port pair (Port 1 to Port 3), in accordance with example embodiments. The graph shows that the signal propagates to the forward path with very small loss (such as −32 to −27 decibel (dB) in the 3-8 GHz range) and the isolated port provides an isolation better than 35 dB in the range of 3-8 GHz. This is superior to any discrete components that are conventionally available, and provides flexibility to the impedance systems.

System Configuration with RFAWG and Reflectometer

Figure 14:
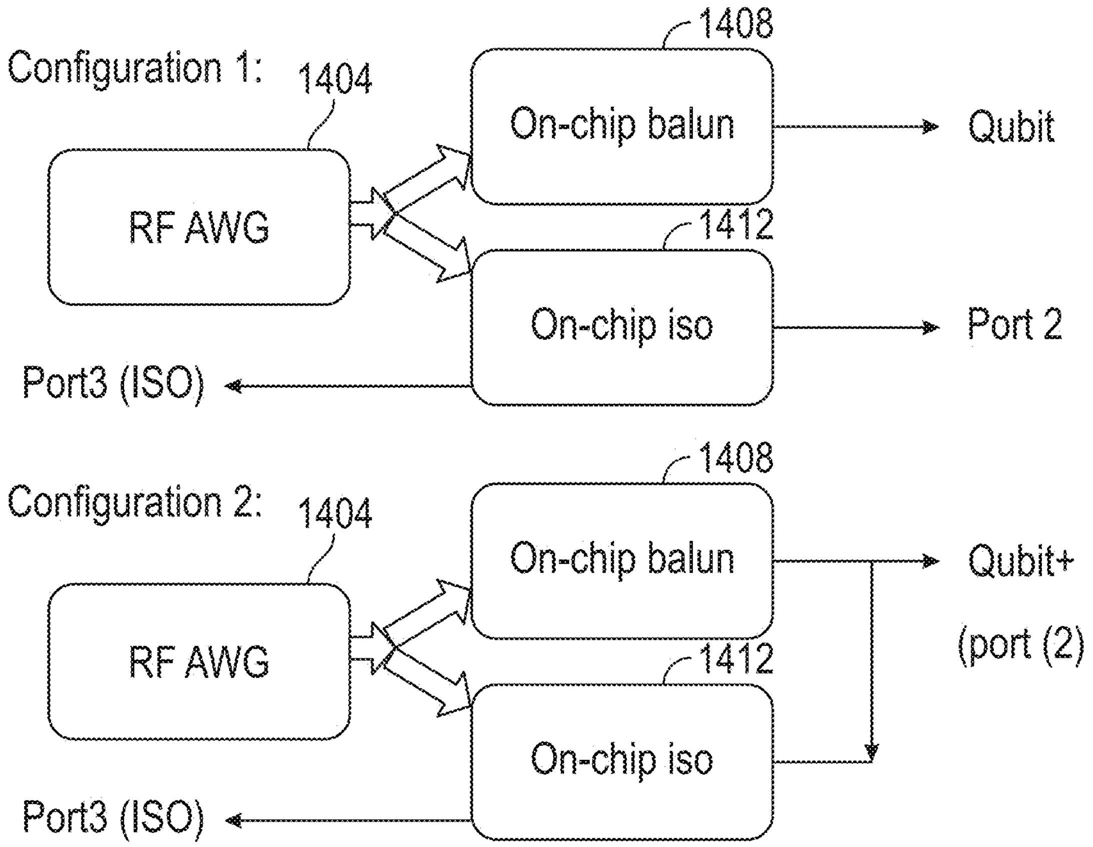
FIG. 14 illustrates two configurations for an RF-AWG using a pseudo-differential structure, in accordance with example embodiments.

FIG. 14 illustrates two configurations for an RF-AWG 1404 using a pseudo-differential structure, in accordance with example embodiments. The configurations can provide differential signals or common mode signals. Configuration 1 is used to provide a differential signal. An on-chip isolator 1412 is used as a differential input and a single-ended output by disabling one half of the chip isolator 1412. An on-chip balun 1408 provides the control signal to the qubit.

Configuration 2 is configured as a differential structure. An on-chip isolator 1412 is used as a differential input and uses current mode cancellation. As with configuration 1, an on-chip balun 1408 provides the control signal to the qubit.

Interface with AWG Output Stack: Configuration 1

Figure 15:
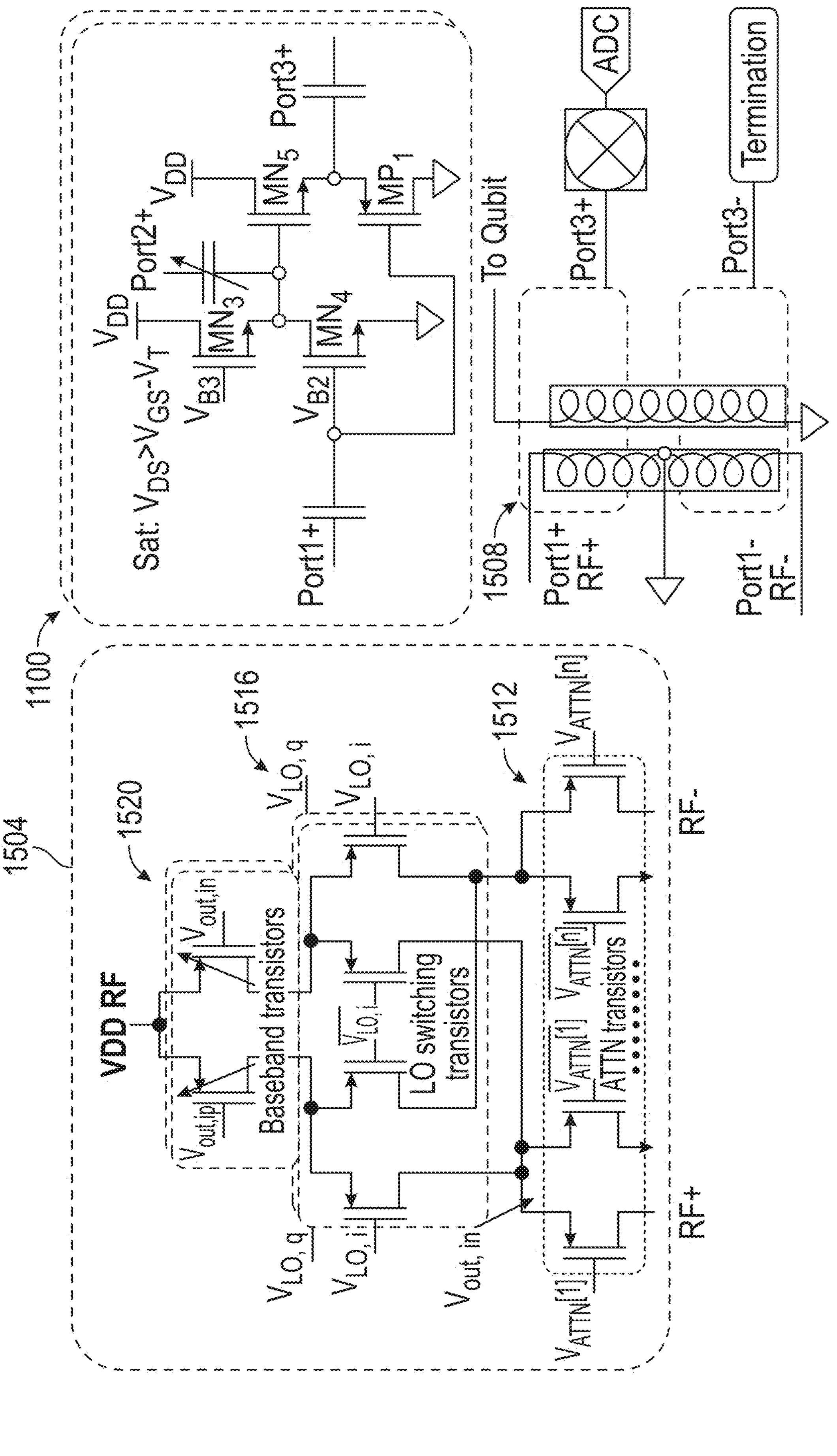
FIG. 15 illustrates the incorporation of the directional device with the output stage AWG of FIGS. 9 and 10 based on Configuration 1 of FIG. 14, in accordance with example embodiments.

FIG. 15 illustrates the incorporation of the directional device 1100 with the output stage AWG 908, 1040 of FIGS. 9 and 10 based on Configuration 1 of FIG. 14, in accordance with example embodiments. The directional device 1100 serves as the on-chip isolator 1412. The RF+ and the RF− ports of the balun 1508 are coupled to the RF+ and the RF− ports of the output stage 1504. Port1+ of the balun 1508 is coupled to Port1+ of the directional device 1100 and Port3+ of the balun 1508 is coupled to Port3+ of the directional device 1100.

A pertinent AWG operation is to power down the CMOS directional device 1100 by setting VB2 and VB3 to 0 volts (V), while directional device 1100 is turned on in test mode by setting VB2 and VB3 to the desired value. It is noted that no series switch is needed. VB2 and VB3 are biasing voltages that are determined by passing a reference current through a replica stack of these transistors. FIG. 15 shows how the structure of FIG. 11 can be placed at the different nodes of the architecture so that the appropriate signals can be sensed and adequate isolation can be provided, as needed.

Interface with AWG Output Stack: Configuration 2

Figure 16:
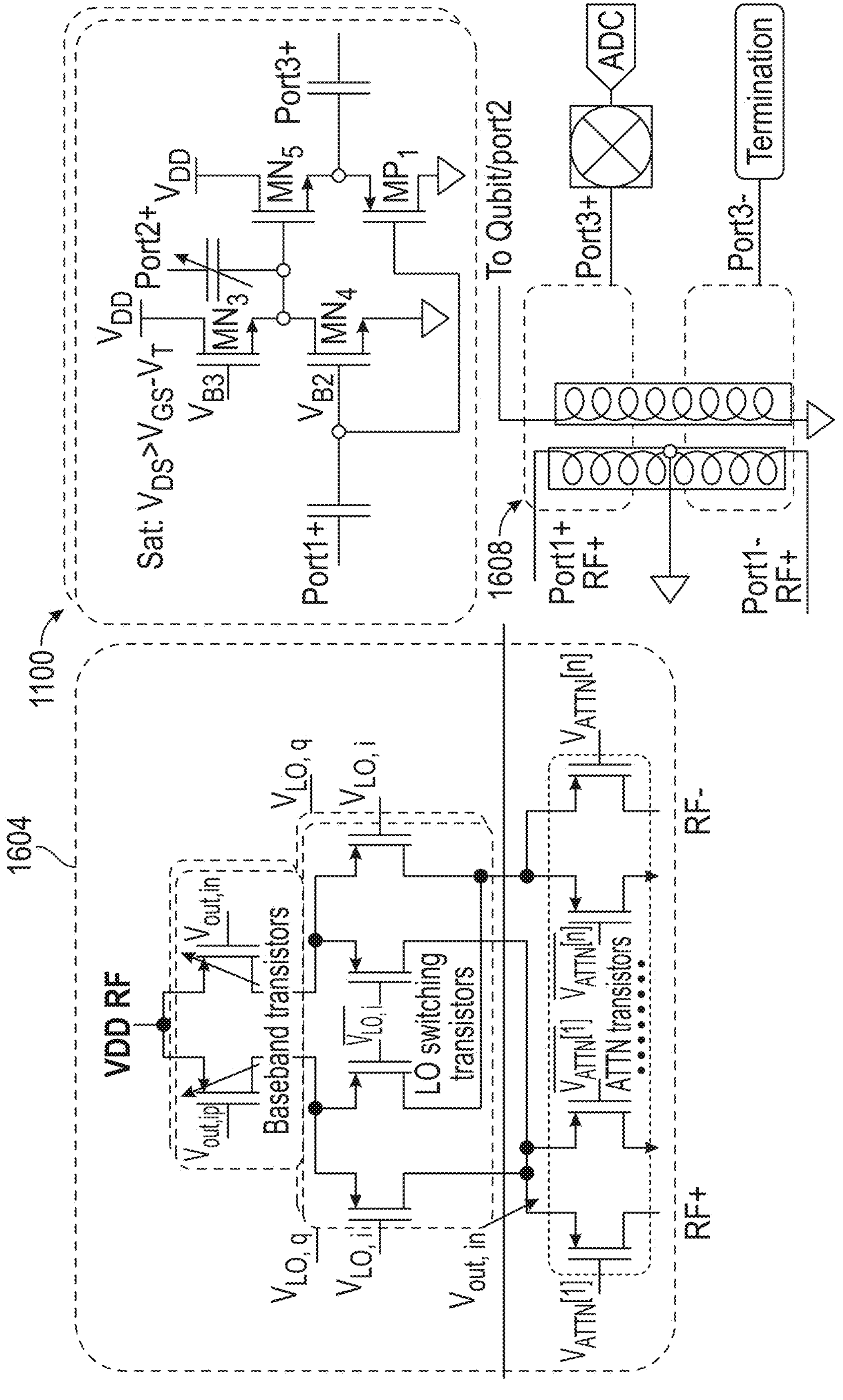
FIG. 16 illustrates the incorporation of the directional device with the output stage AWG of FIGS. 9 and 10 based on Configuration 2 of FIG. 14, in accordance with example embodiments.

FIG. 16 illustrates the incorporation of the directional device 1100 with the output stage AWG 908, 1040 of FIGS. 9 and 10 based on Configuration 2 of FIG. 14, in accordance with example embodiments. The directional device 1100 serves as the on-chip isolator 1412. The RF+ and the RF− ports of the balun 1608 are coupled to the RF+ and the RF− ports of the output stage 1604. Port1+ of the balun 1608 is coupled to Port1+ of the directional device 1100 and Port3+ of the balun 1608 is coupled to Port3+ of the directional device 1100.

The main AWG operation is to power down the CMOS directional device 1100 by setting VB2 and VB3 to 0 volts (V), while directional device 1100 is turned on in test mode by setting VB2 and VB3 to the desired value. It is noted that no series switch is needed. The net signal caused by magnetic coupling equals zero due to the common mode drive from the RF-AWG 1604. A single-ended signal (half signal) is available at PORT1+ and PORT1− with the same phase.

Implementation of Shared Port Configuration

Figure 17:
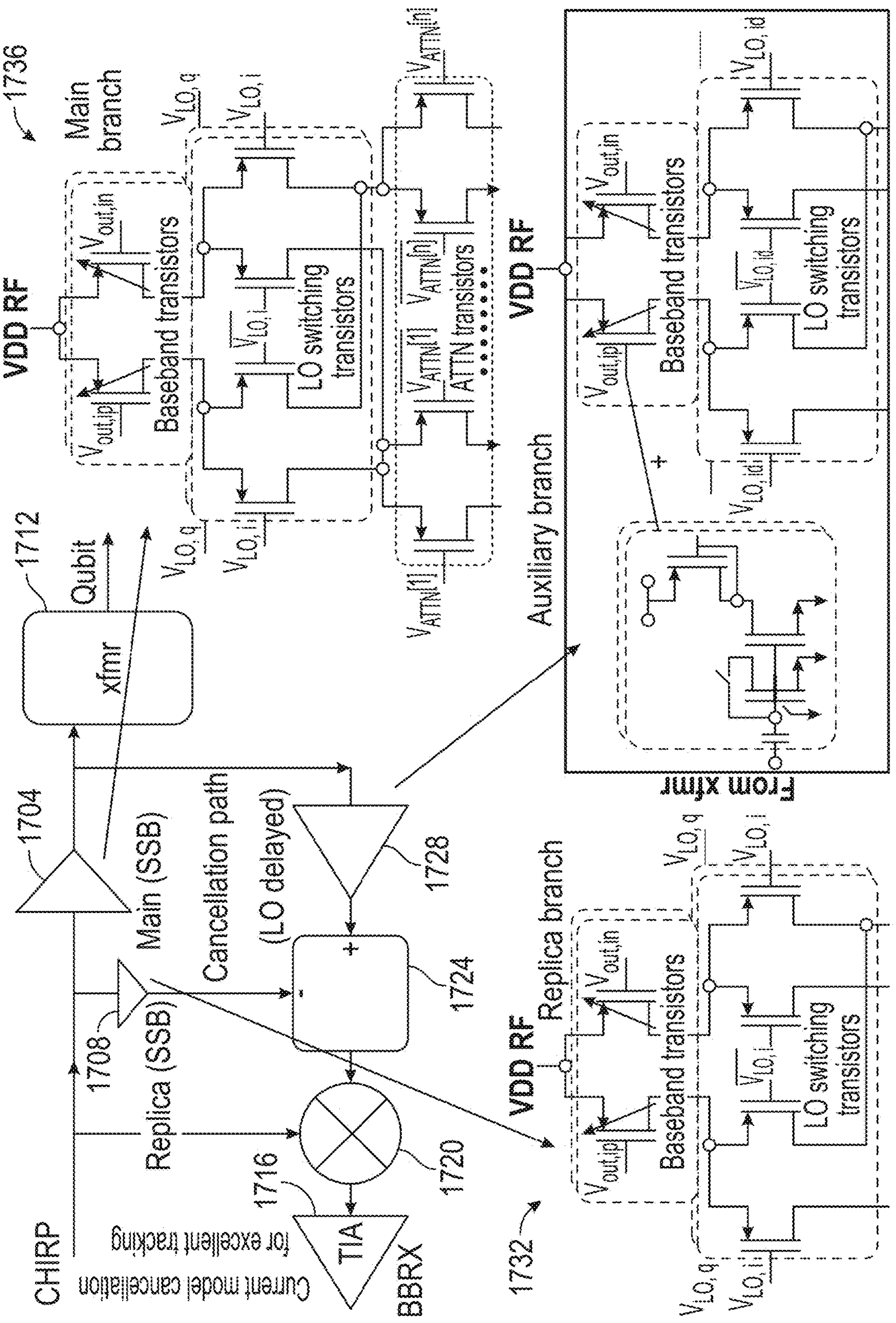
FIG. 17 is a circuit diagram of a shared port configuration, in accordance with example embodiments.

FIG. 17 is a circuit diagram of a shared port configuration, in accordance with example embodiments. In example embodiments, a chirp signal is split and provided to a main single sideband (SSB) amplifier 1704 and a replica SSB amplifier 1708. In addition, the chirp is provided to one input of a mixer 1720. The output of the main SSB 1704 is sent down a line under test toward a given qubit via an output stage 1712. The reflected signal is input to an amplifier 1728. The output of the replica SSB amplifier 1708 is subtracted from the amplified reflected signal by an adder 1724. The adder 1724 essentially cancels the forward wave voltage and leaves only the reflected signal. The reflected signal, as output by the adder 1724, is mixed with the original chirp by mixer 1720 and passed through a trans-impedance amplifier 1716 to an ADC (not shown).

As described above, the chirp signal is sent to three paths: the mixer 1720, the replica SSB amplifier 1708 and the SSB amplifier 1704. The SSB amplifier 1704 drives the transmission line under test using the transformer 1712. The reflected signal from the transmission line adds to the forward voltage along the transmission line and the sum of these two voltages passes through amplifier 1728 to the adder 1724. It is important to note that the chirp length should be significantly longer in time than the propagation time of the transmission line under test. In adder 1724, the original forwarded signal is subtracted from the sum of the forward and reflected signals. As a result, at the output of adder 1724, there is a new chirp that is delayed in time proportional to the distance from a discontinuity in the line. The delayed chirp is mixed in the mixer 1720 with the original chirp and, as a result, at the output of the mixer 1720, a single frequency tone is derived if there is one discontinuity in the line under test or a multitone signal is derived if there are multiple discontinuities. By performing a FFT on the resulting signal, a TDR plot of the line is extracted, as shown in FIGS. 18D-18E.

Considerations for Interference Cancellation

In one or more embodiments, the replica and the cancellation paths are constructed using a scaled version of the main path signal, resulting in low power and small circuit area. Interference cancellation can be performed using a single resistive load, resulting in a small circuit area. A delay adjustment can be made for the cancellation path using the transistors of the local oscillator (LO). Cancellation uses smaller size transistors compared to the main stack, resulting in very little loading on the main signal path.

Example embodiments provide an isolator functionality. In this capacity, the main function of the circuit is to enable signal propagation from a first port to a second port, and to transfer no signal to a third port. Unlike discrete implementations of power combiners, the disclosed structure can provide a non-50 ohm impedance, which enables a straightforward interface with on-chip circuitry.

Experimental Measurements

Figure 18A:
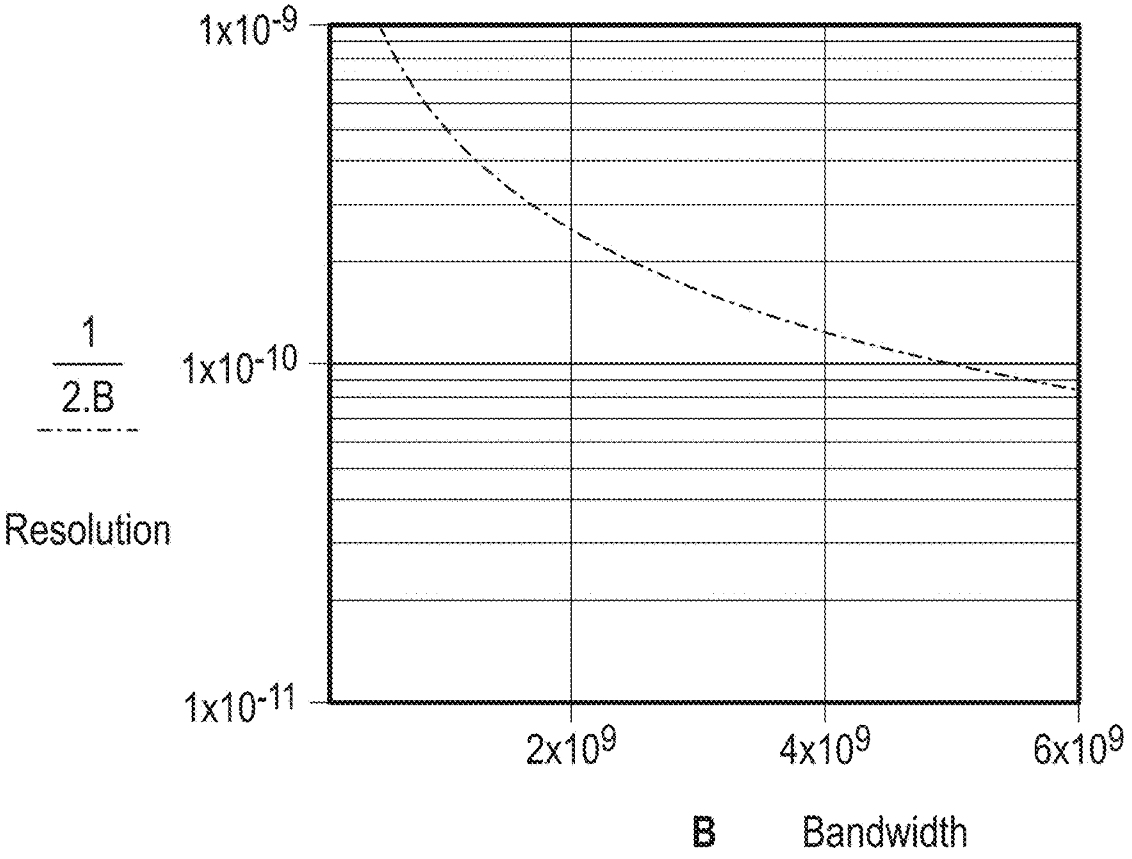
FIG. 18A is a graph of resolution vs. bandwidth, in accordance with example embodiments.

FIG. 18A is a graph of resolution vs. bandwidth, in accordance with example embodiments. In the example measurements of FIGS. 18A-F, the chirp bandwidth B was 5 GHz, the resolution d was 0.5/B, the chirp duration was Tc equals 0.04 second, the slope S is defined as B/Tc, the delay to open is dT=1 ns, and the beat frequency F=2*S*dT=250 Hz.

Figure 18B:
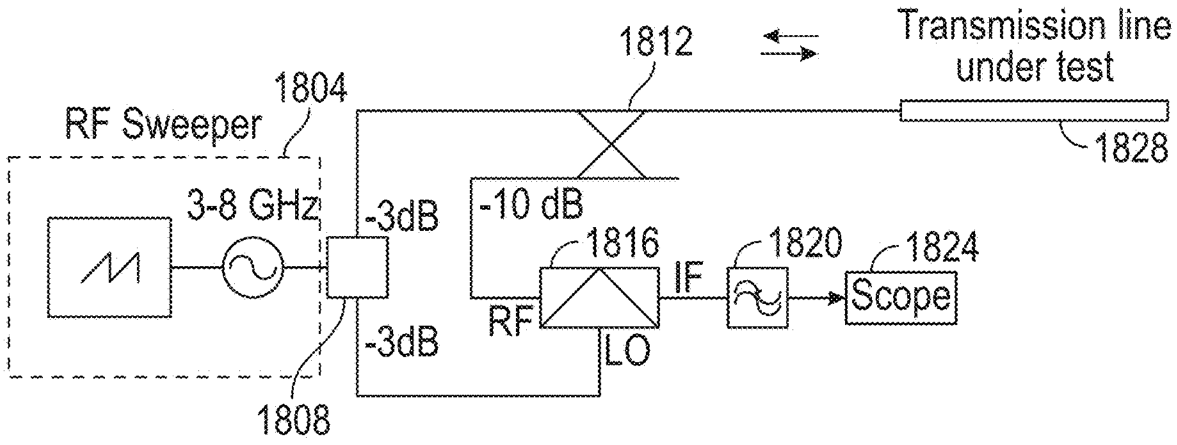
FIG. 18B illustrates a block diagram of an experimental configuration for testing the directional device, in accordance with example embodiments.

FIG. 18B illustrates a block diagram of an experimental configuration for testing the directional device 1100, in accordance with example embodiments. An RF sweeper 1804 generates a signal that sweeps through a frequency range of 3-8 GHz. A splitter 1808 splits the swept signal and provides it to a directional coupler 1812 and a mixer 1816. The directional coupler 1812 allows the swept signal to pass down the transmission line under test 1828, and allows the reflected signal to pass to the mixer 1816. The mixer 1816 mixes the reflected signal and the swept signal to generate signal 1820, which is displayed as a waveform by oscilloscope 1824.

Figure 18C:
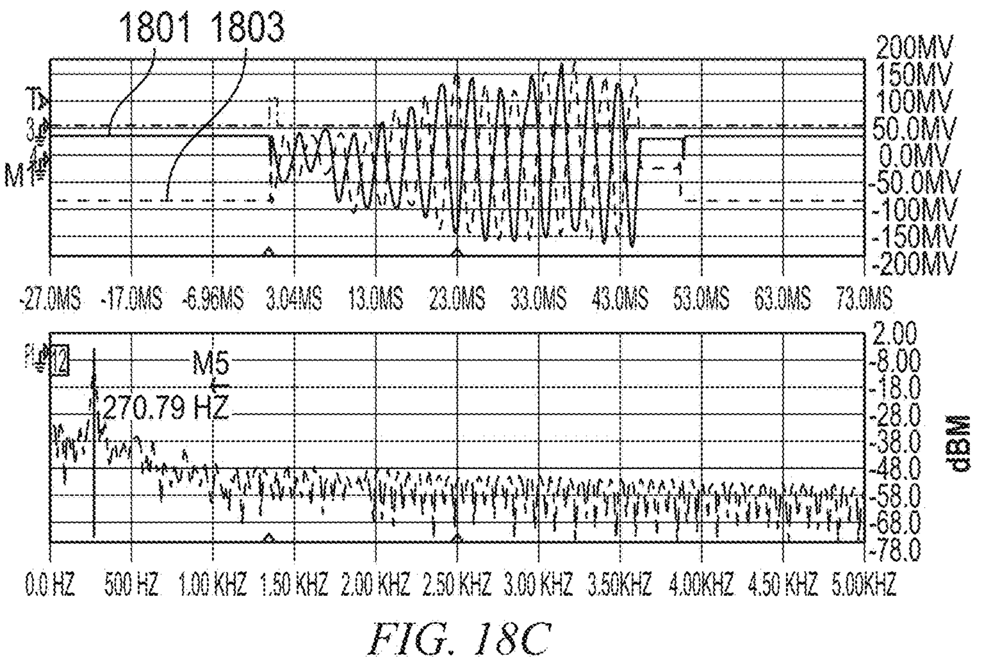
FIG. 18C shows frequency domain representations of the results of mixing two chirps: a transmitted chirp and a reflected chirp, in accordance with example embodiments.
Figure 18D:
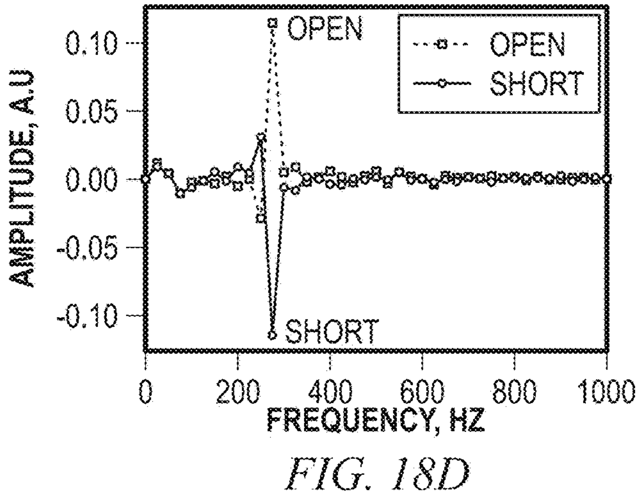
FIG. 18D illustrates the complex FFT of the product of two chirps transmitted and reflected from the transmission line under test for an open load and a short load, in accordance with example embodiments.
Figure 18E:
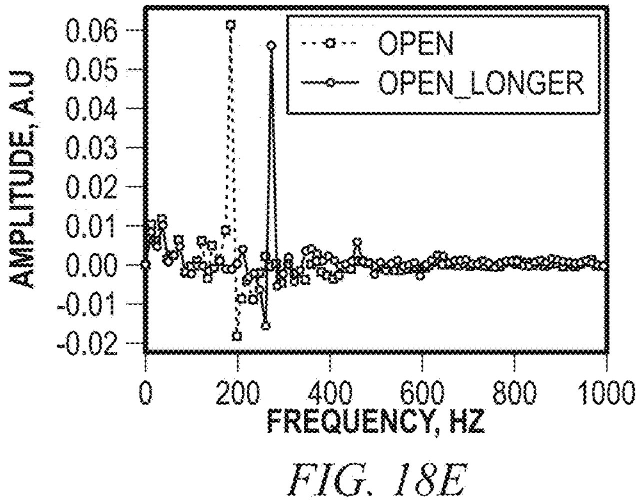
FIG. 18E illustrates the complex FFT of the product of two chirps transmitted and reflected from the shorter transmission line under test for an open load and a short load, in accordance with example embodiments.

FIG. 18C shows frequency domain representations of the results of mixing two chirps: a transmitted chirp and a reflected chirp, in accordance with example embodiments. The line 1801 corresponds to a shorted transmission line and the line 1803 corresponds to an open transmission line. Taking the inverse fast Fourier transform (IFFT) results in the 270 Hz peak shown in the lower half of FIG. 18C, which is proportional to the delay between the two chirps, and proportional to the delay between the beginning of the transmission line under test 1828 and the end of the transmission line under test 1828. FIG. 18D illustrates the complex FFT of the product of two chirps transmitted and reflected from the transmission line under test 1828 for an open load and a short load, in accordance with example embodiments. FIG. 18E illustrates the complex FFT of the product of two chirps transmitted and reflected from the shorter transmission line under test 1828 for an open load and a short load, in accordance with example embodiments.

Moderate Resolution Chirp Generation

Given the teachings herein, the skilled artisan can also adapt a number of prior art chirp generation techniques to implement aspects of the invention.

Given the discussion thus far, it will be appreciated that, in general terms, an exemplary method, according to an aspect of the invention, includes the operations of enabling a directional device 1100, 1200 integrated into a cryogenic circuit while performing time domain reflectometry on a control line of a qubit; and disabling the directional device 1100, 1200 while generating control signals for the qubit.

In example embodiments, the control line is replaced in response to the performance of the time domain reflectometry identifying an impedance that violates a specified impedance range.

In example embodiments, parameters of the generated control signals are adjusted based on a result of the performance of the time domain reflectometry.

In example embodiments, the directional device comprises a first port; a second port; and a third port, wherein the directional device is configured to pass a signal from the first port to the second port, to block a signal from passing from the second port to the first port, to pass a signal from the second port to the third port, and to isolate the first port from the third port.

In example embodiments, each port of the directional device is configured to interface to electronic circuitry for a range of impedances.

In example embodiments, the first port is alternating current (AC) coupled to the second port and the first port is alternating current (AC) coupled to the third port.

In example embodiments, the directional device is configured to enable time domain reflectometry on a control line of a qubit.

In one aspect, a system comprises a digitally programmable frequency chirp generator 804 configured to generate a frequency chirp; an attenuator 1512 coupled to the digitally programmable frequency chirp generator; and a directional device 1100, 1200 integrated into a cryogenic circuit configured to control superconducting qubits and coupled to the digitally programmable frequency chirp generator, the directional device 1100, 1200 comprising a main arbitrary waveform generator and an on-chip programmable self-interference canceller.

In example embodiments, a frequency tunable output stage (see FIG. 15) is configured to process the frequency chirp, the frequency tunable output stage comprising a baseband transistor pair 1520, a local oscillator switching transistor stack 1516 coupled to the attenuator 1512, and a tunable resonant network 1508 configured for a given center frequency and a bandwidth adjustment.

In example embodiments, the chirp is provided using a baseband circuit coupled to an up-conversion mixer.

In example embodiments, the digitally programmable frequency chirp generator further comprises an in-situ phase-locked loop (PLL) and the chirp is provided using the in-situ phase-locked loop (PLL).

In example embodiments, the frequency tunable output stage is used in a main signal path for qubit control.

In example embodiments, a cryostat encloses the digitally programmable frequency chirp generator, the attenuator 1512 and the directional device 1100, 1200.

In example embodiments, the directional device comprises a first port; a second port; and a third port, wherein the directional device is configured to pass a signal from the first port to the second port, to block a signal from passing from the second port to the first port, to pass a signal from the second port to the third port, and to isolate the first port from the third port (in this context, "isolate" simply means to block signals in both directions).

In example embodiments, each port of the directional device is configured to interface to electronic circuitry for a range of impedances. Given the teachings herein, the skilled artisan can appreciate a suitable range such as, e.g., 0 to 1000 ohms, or more particularly, e.g., 10 to 100 ohms, based on the type of transistors used and on the frequency band used.

In example embodiments, the first port is alternating current (AC) coupled to the second port and the first port is alternating current (AC) coupled to the third port.

In example embodiments, the directional device is configured to enable time domain reflectometry on a control line of a qubit on demand.

In one aspect, a directional device 1100, 1200 comprises a first port; a second port; and a third port, wherein the directional device 1100, 1200 is configured to pass a signal from the first port to the second port, to block a signal from passing from the second port to the first port, to pass a signal from the second port to the third port, and to isolate the first port from the third port. The technical benefits including enabling interfacing with on-chip circuitry over a range of interface impedances.

In example embodiments, each port is configured to interface to electronic circuitry for a range of impedances.

In example embodiments, the first port is alternating current (AC) coupled to the second port and the first port is alternating current (AC) coupled to the third port.

Figure 19:
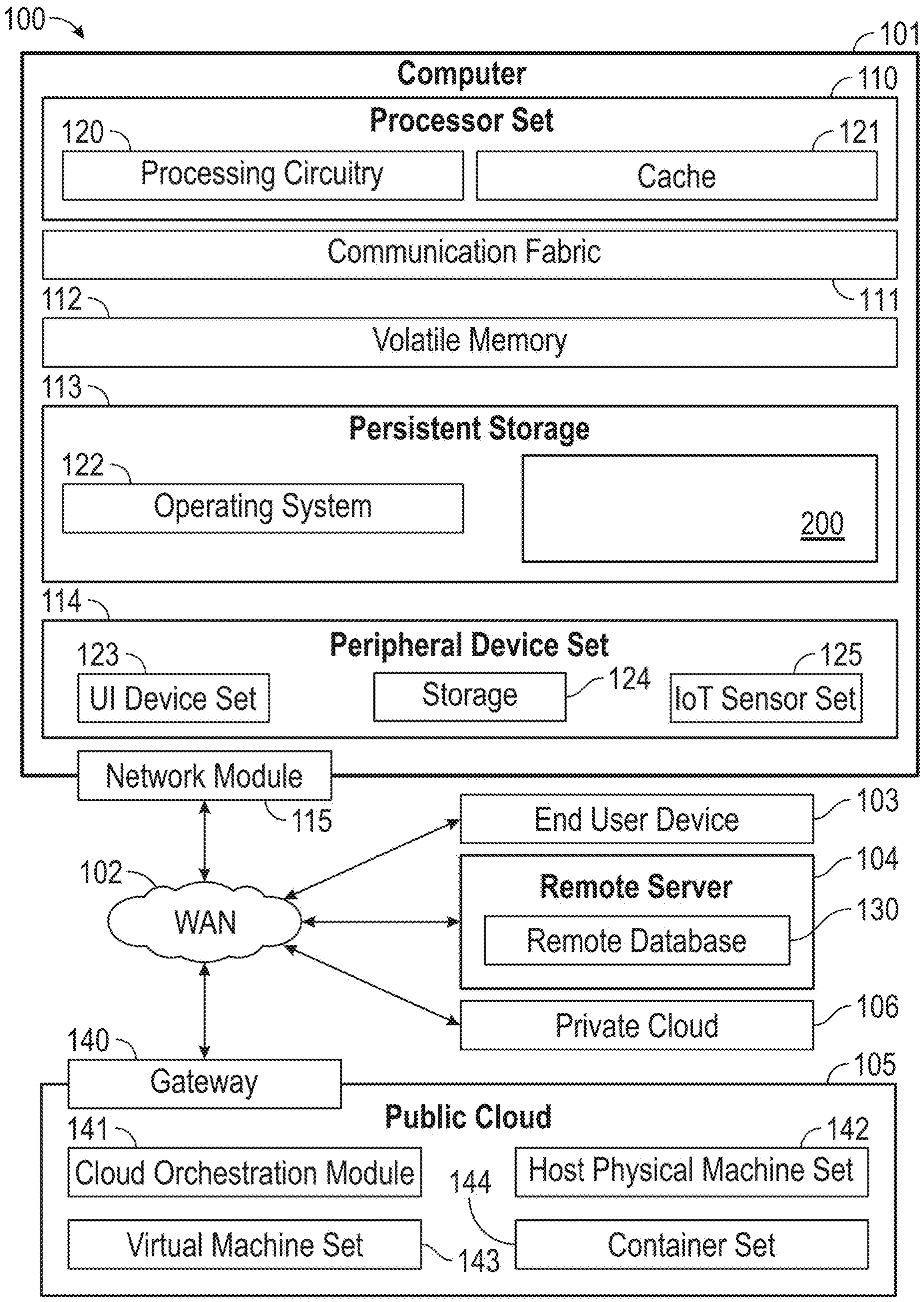
FIG. 19 depicts a computing environment according to an embodiment of the present invention.

Refer now to FIG. 19.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 20:
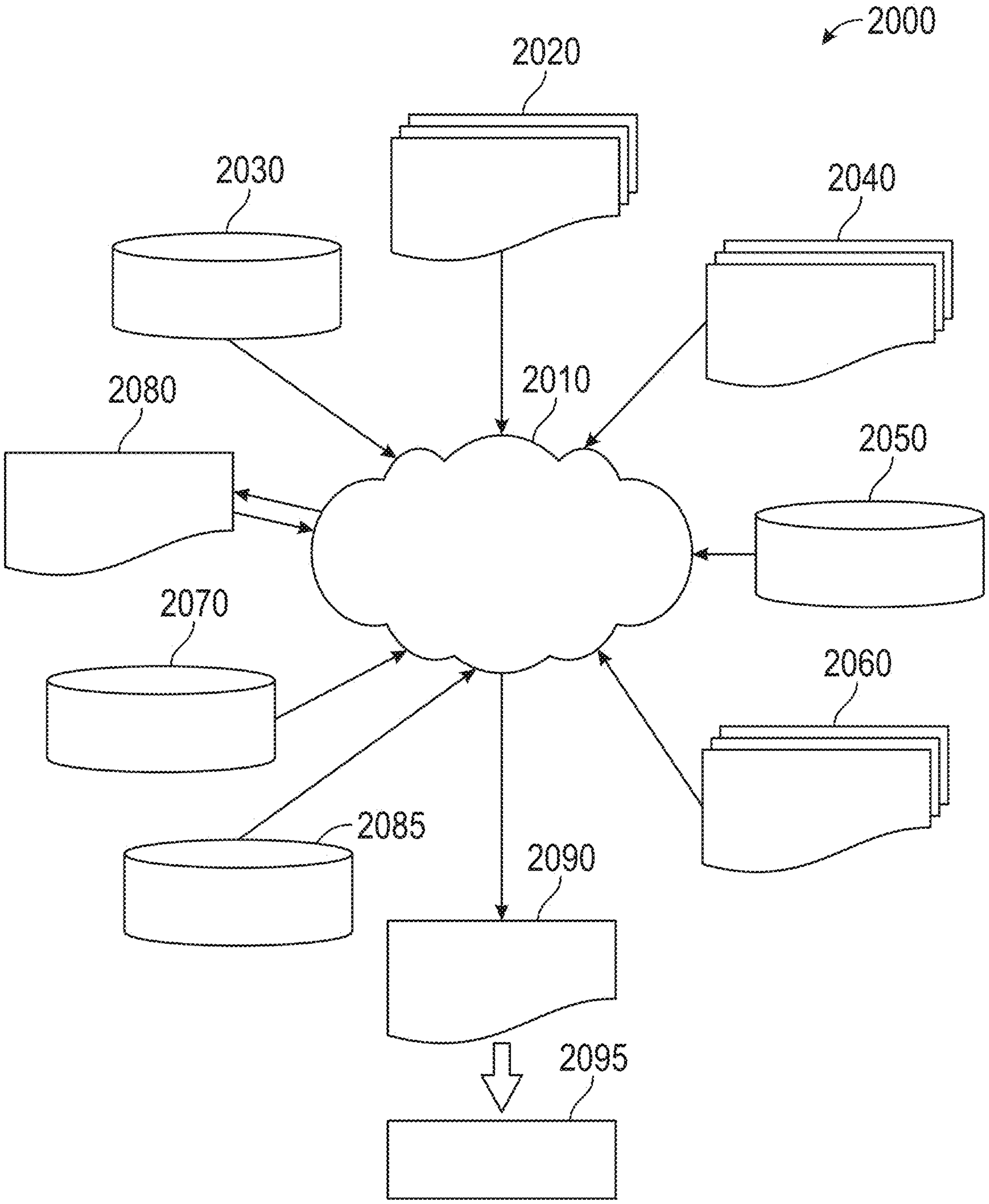
FIG. 20 is a flow diagram of a design process used in semiconductor design, manufacture, and/or test.

Computing environment 100 contains an example of an environment for the execution of at least some of the computer code involved in performing the inventive methods, such as TDR controller system (to turn impedance measurement off and on) as well as software aspects of the design flow of FIG. 20, all generally represented by block 200. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 19. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test One or more embodiments make use of computer-aided semiconductor integrated circuit design simulation, test, layout, and/or manufacture. In this regard, FIG. 20 shows a block diagram of an exemplary design flow 2000 used for example, in semiconductor IC logic design, simulation, test, layout, and manufacture. Design flow 2000 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 2000 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2000 may vary depending on the type of representation being designed. For example, a design flow 2000 for building an application specific IC (ASIC) may differ from a design flow 2000 for designing a standard component or from a design flow 2000 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 2020 that is preferably processed by a design process 2010. Design structure 2020 may be a logical simulation design structure generated and processed by design process 2010 to produce a logically equivalent functional representation of a hardware device. Design structure 2020 may also or alternatively comprise data and/or program instructions that when processed by design process 2010, generate a functional representation of the physical structure of a hardware device. Whether representing functional and/or structural design features, design structure 2020 may be generated using electronic computer-aided design (ECAD) such as implemented by a core developer/designer. When encoded on a gate array or storage medium or the like, design structure 2020 may be accessed and processed by one or more hardware and/or software modules within design process 2010 to simulate or otherwise functionally represent an electronic component, circuit, electronic or logic module, apparatus, device, or system. As such, design structure 2020 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2010 preferably employs and incorporates hardware and/or software modules for synthesizing, translating, or otherwise processing a design/simulation functional equivalent of components, circuits, devices, or logic structures to generate a Netlist 2080 which may contain design structures such as design structure 2020. Netlist 2080 may comprise, for example, compiled or otherwise processed data structures representing a list of wires, discrete components, logic gates, control circuits, I/O devices, models, etc. that describes the connections to other elements and circuits in an integrated circuit design. Netlist 2080 may be synthesized using an iterative process in which netlist 2080 is resynthesized one or more times depending on design specifications and parameters for the device. As with other design structure types described herein, netlist 2080 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 2010 may include hardware and software modules for processing a variety of input data structure types including Netlist 2080. Such data structure types may reside, for example, within library elements 2030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2040, characterization data 2050, verification data 2060, design rules 2070, and test data files 2085 which may include input test patterns, output test results, and other testing information. Design process 2010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2010 without deviating from the scope and spirit of the invention. Design process 2010 may also include modules for performing standard circuit design processes such as timing analysis, verification, design rule checking, place and route operations, etc.

Design process 2010 employs and incorporates logic and physical design tools such as HDL compilers and simulation model build tools to process design structure 2020 together with some or all of the depicted supporting data structures along with any additional mechanical design or data (if applicable), to generate a second design structure 2090. Design structure 2090 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 2020, design structure 2090 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 2090 may comprise a compiled, executable HDL simulation model that functionally simulates the devices to be analyzed.

Design structure 2090 may also employ a data format used for the exchange of layout data of integrated circuits and/or symbolic data format (e.g. information stored in a GDSII (GDS2), GL1, OASIS, map files, or any other suitable format for storing such design data structures). Design structure 2090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 2090 may then proceed to a stage 2095 where, for example, design structure 2090: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:

a digitally programmable frequency chirp generator configured to generate a frequency chirp;

an attenuator coupled to the digitally programmable frequency chirp generator; and a directional device integrated into a cryogenic circuit configured to control superconducting qubits and coupled to the digitally programmable frequency chirp generator, the directional device comprising a main arbitrary waveform generator and an on-chip programmable self-interference canceller.

2. The system of claim 1, further comprising a frequency tunable output stage configured to process the frequency chirp, the frequency tunable output stage comprising a baseband transistor pair, a local oscillator switching transistor stack coupled to the attenuator, and a tunable resonant network configured for a given center frequency and a bandwidth adjustment.

3. The system of claim 2, wherein the frequency tunable output stage is used in a main signal path for qubit control.

4. The system of claim 1, wherein the chirp is provided using a baseband circuit coupled to an up-conversion mixer.

5. The system of claim 1, the digitally programmable frequency chirp generator further comprising an in-situ phase-locked loop (PLL) and wherein the chirp is provided using the in-situ phase-locked loop (PLL).

6. The system of claim 1, further comprising a cryostat enclosing the digitally programmable frequency chirp generator, the attenuator and the directional device.

7. The system of claim 1, wherein the directional device comprises:

a first port;

a second port; and a third port, wherein the directional device is configured to pass a signal from the first port to the second port, to block a signal from passing from the second port to the first port, to pass a signal from the second port to the third port, and to isolate the first port from the third port.

8. The system of claim 7, wherein each port of the directional device is configured to interface to electronic circuitry for a range of impedances.

9. The system of claim 7, wherein the first port is alternating current (AC) coupled to the second port and wherein the first port is alternating current (AC) coupled to the third port.

10. The system of claim 7, wherein the directional device is configured to enable time domain reflectometry on a control line of a qubit on demand.

11. A directional device comprising:

a first port;

a second port;

a third port;

a first transistor and a second transistor directly coupled to the first port;

a third transistor and a fourth transistor directly coupled to the second port;

a fifth transistor directly coupled to the second port and the third port; and a sixth transistor directly coupled to the third port, wherein the first transistor and the second transistor are not directly coupled to the second port and the third port, wherein the third transistor and the fourth transistor are not directly coupled to the first port, wherein the sixth transistor is not directly coupled to the second port, and wherein the directional device is configured to pass a signal from the first port to the second port, to block a signal from passing from the second port to the first port, to pass a signal from the second port to the third port, and to isolate the first port from the third port.

12. The directional device of claim 11, wherein each port is configured to interface to electronic circuitry for a range of impedances.

13. The directional device of claim 11, further comprising:

a first capacitor directly coupled to the first port; and a second capacitor directly coupled to the sixth transistor, and wherein the first port is alternating current (AC) coupled to the second port and wherein the first port is alternating current (AC) coupled to the third port.

14. A method comprising:

enabling a directional device integrated into a cryogenic circuit while performing time domain reflectometry on a control line of a qubit; and disabling the directional device while generating control signals for the qubit.

15. The method of claim 14, further comprising replacing the control line in response to the performance of the time domain reflectometry identifying an impedance that violates a specified impedance range.

16. The method of claim 14, further comprising adjusting parameters of the generated control signals based on a result of the performance of the time domain reflectometry.

17. The method of claim 14, wherein the directional device comprises:

a first port;

a second port; and a third port, wherein the directional device is configured to pass a signal from the first port to the second port, to block a signal from passing from the second port to the first port, to pass a signal from the second port to the third port, and to isolate the first port from the third port.

18. The method of claim 17, wherein each port of the directional device is configured to interface to electronic circuitry for a range of impedances.

19. The method of claim 17, wherein the first port is alternating current (AC) coupled to the second port and wherein the first port is alternating current (AC) coupled to the third port.

20. The method of claim 17, wherein the directional device is configured to enable time domain reflectometry on a control line of a qubit.

* * * * *